United States Patent [19]

Murphy

[11] Patent Number: 5,157,325
[45] Date of Patent: Oct. 20, 1992

[54] COMPACT, WIRELESS APPARATUS FOR ELECTRICALLY TESTING PRINTED CIRCUIT BOARDS

[75] Inventor: Patrick K. Murphy, Spring, Tex.

[73] Assignee: Compaq Computer Corporation, Houston, Tex.

[21] Appl. No.: 656,578

[22] Filed: Feb. 15, 1991

[51] Int. Cl.$^5$ .................. G01R 1/02; G01R 1/067
[52] U.S. Cl. .................. 324/158 F; 324/72.5; 324/158 P
[58] Field of Search .......... 324/158 P, 158 F, 72.5

[56] References Cited

U.S. PATENT DOCUMENTS

| | | | |
|---|---|---|---|
| 3,970,934 | 7/1979 | Aksu | 324/158 F |
| 4,115,735 | 9/1978 | Stanford | 324/158 F |
| 4,518,914 | 5/1985 | Okubo et al. | 324/158 F |
| 4,528,500 | 7/1985 | Lightbody et al. | 324/158 F |
| 4,551,673 | 11/1985 | Barth et al. | 324/158 F |
| 4,746,861 | 5/1988 | Nesbitt | 324/158 F |
| 4,797,610 | 1/1989 | Fombellida | 324/158 F |
| 4,833,402 | 5/1989 | Boegh-Petersen | 324/158 F |
| 4,841,241 | 6/1989 | Hily et al. | 324/158 F |
| 4,952,871 | 8/1990 | Driller et al. | 324/158 F |

FOREIGN PATENT DOCUMENTS

| | | | |
|---|---|---|---|
| 0062833 | 10/1982 | European Pat. Off. | 324/158 F |
| 0056176 | 3/1984 | Japan | 324/158 F |

Primary Examiner—Ernest F. Karlsen
Assistant Examiner—William J. Burns
Attorney, Agent, or Firm—Konneker & Bush

[57] ABSTRACT

A wireless test system is provided for simultaneously performing electrical tests on the opposite sides of a printed circuit board. Specially designed, double-ended pogo pins are utilized to electrically interconnect the top and bottom sides of the board under test to top and bottom printed circuit interface boards, positioned above and below the board being tested, which are electrically interconnected by a flexible printed circuit ribbon. Upwardly projecting test pins on a test and analysis circuit are engaged with contact points on the lower side of the bottom interface board to complete the wireless interconnection between the board being tested and the test and analysis circuit. The double-ended pogo pins are brought into operative engagement with the top and bottom sides of the circuit board being tested by a vacuum-operated actuation system which vertically moves presser bar members to mechanically effect pogo pin engagement with the circuit board being tested without directly exposing the board to the vacuum being created. The wireless system may thus be utilized to test printed circuit boards of either perforate or imperforate construction.

9 Claims, 5 Drawing Sheets

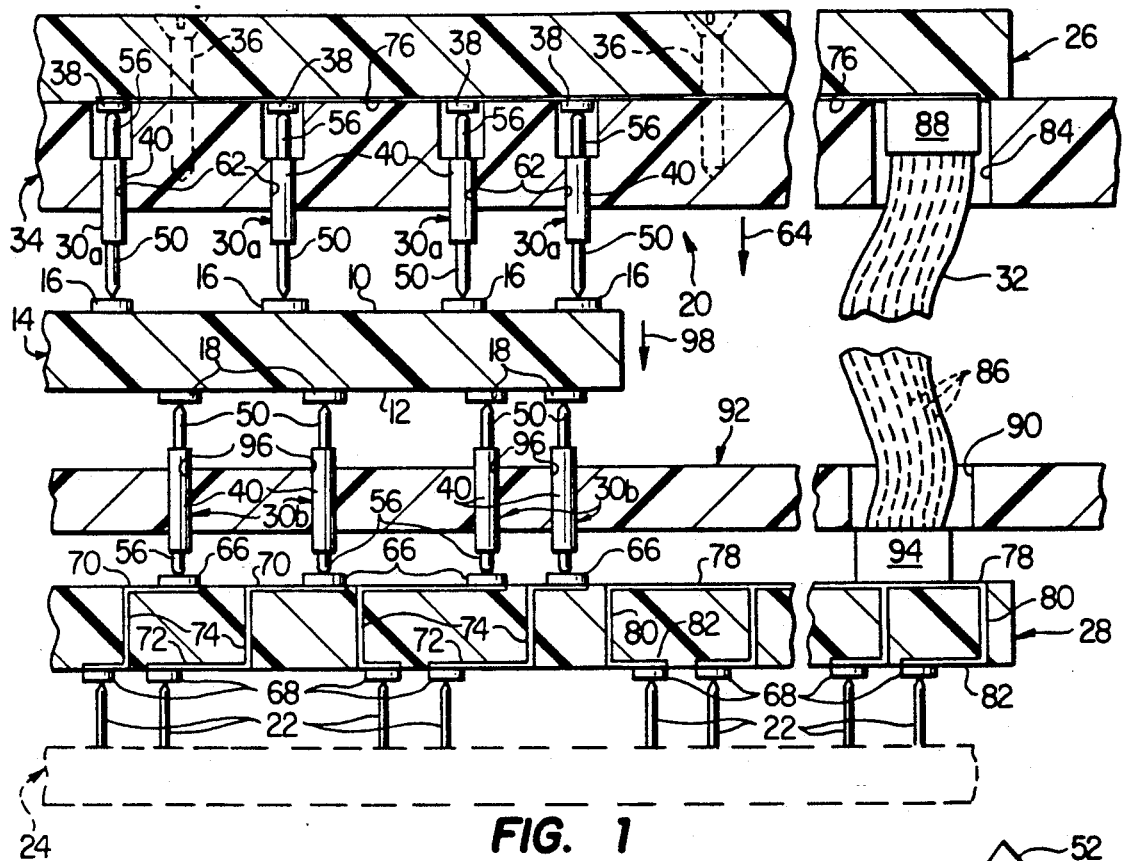
FIG. 1
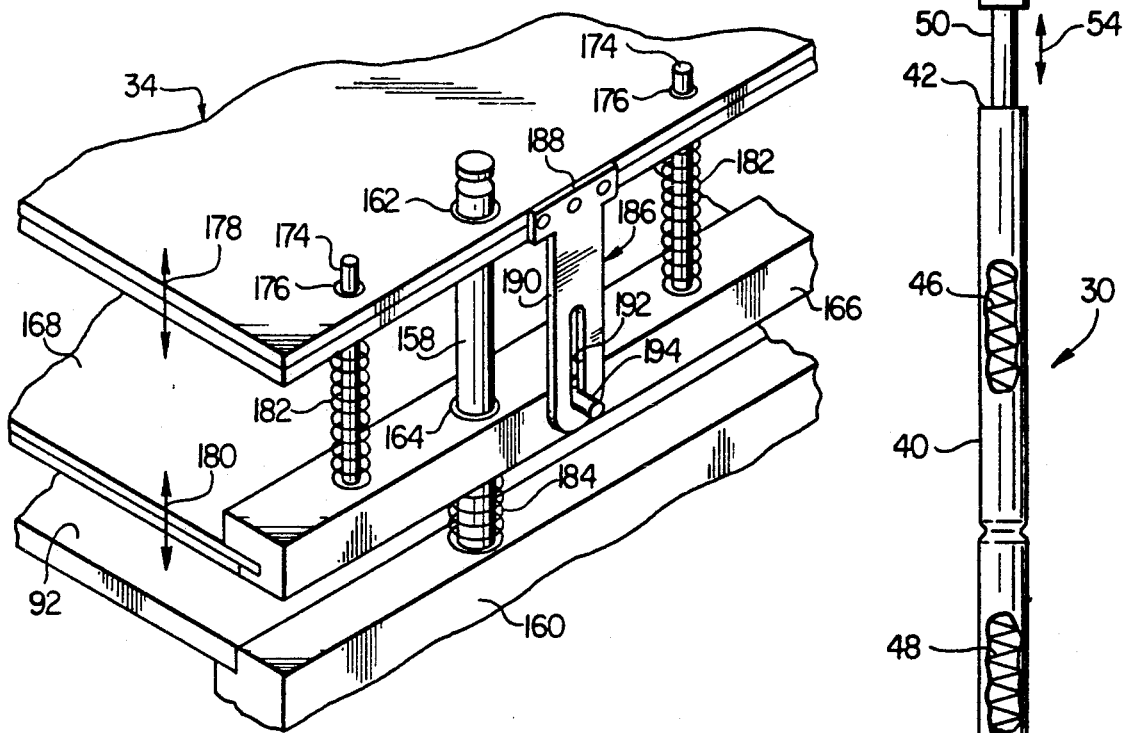
FIG. 7
FIG. 2

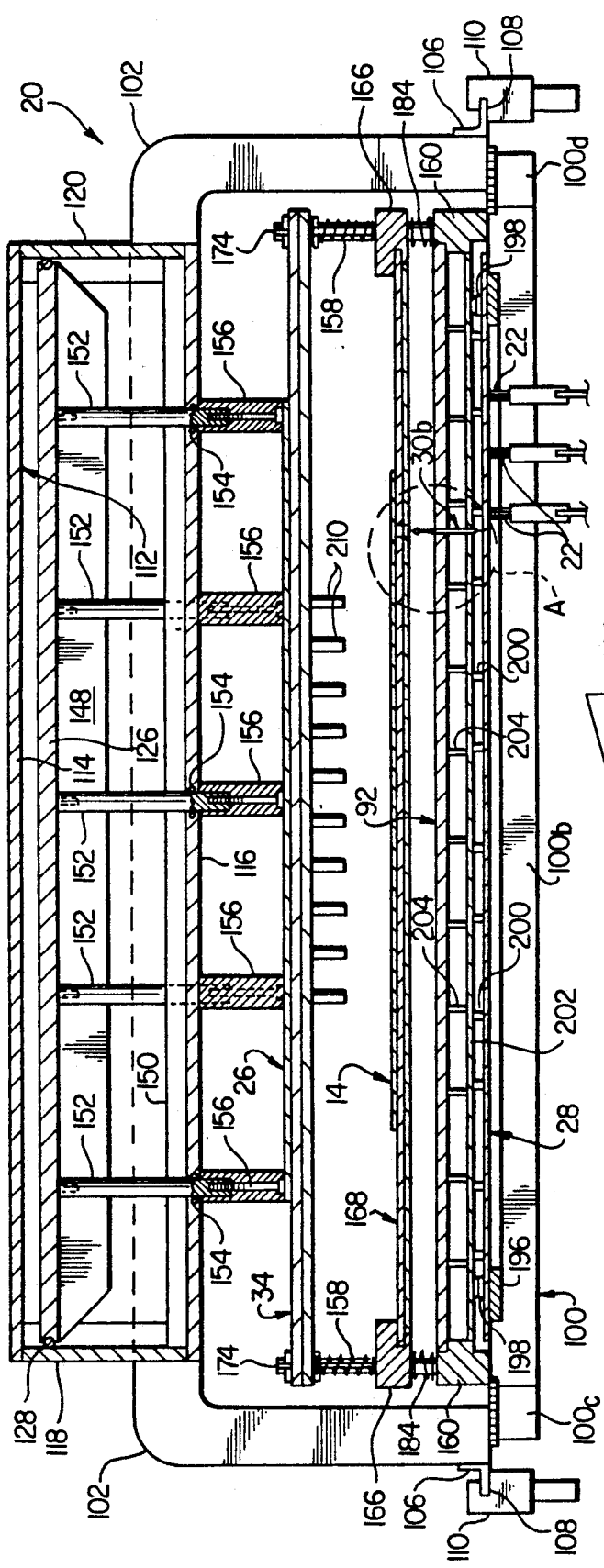
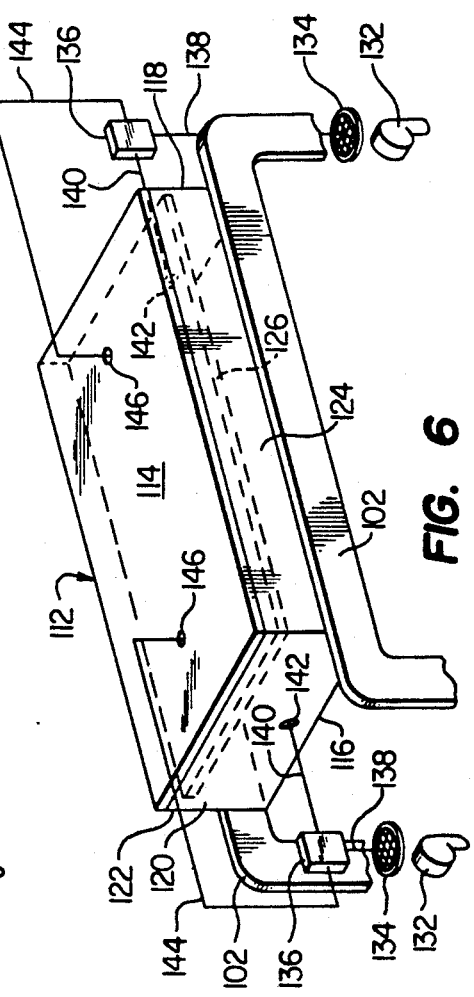
FIG. 5
FIG. 6

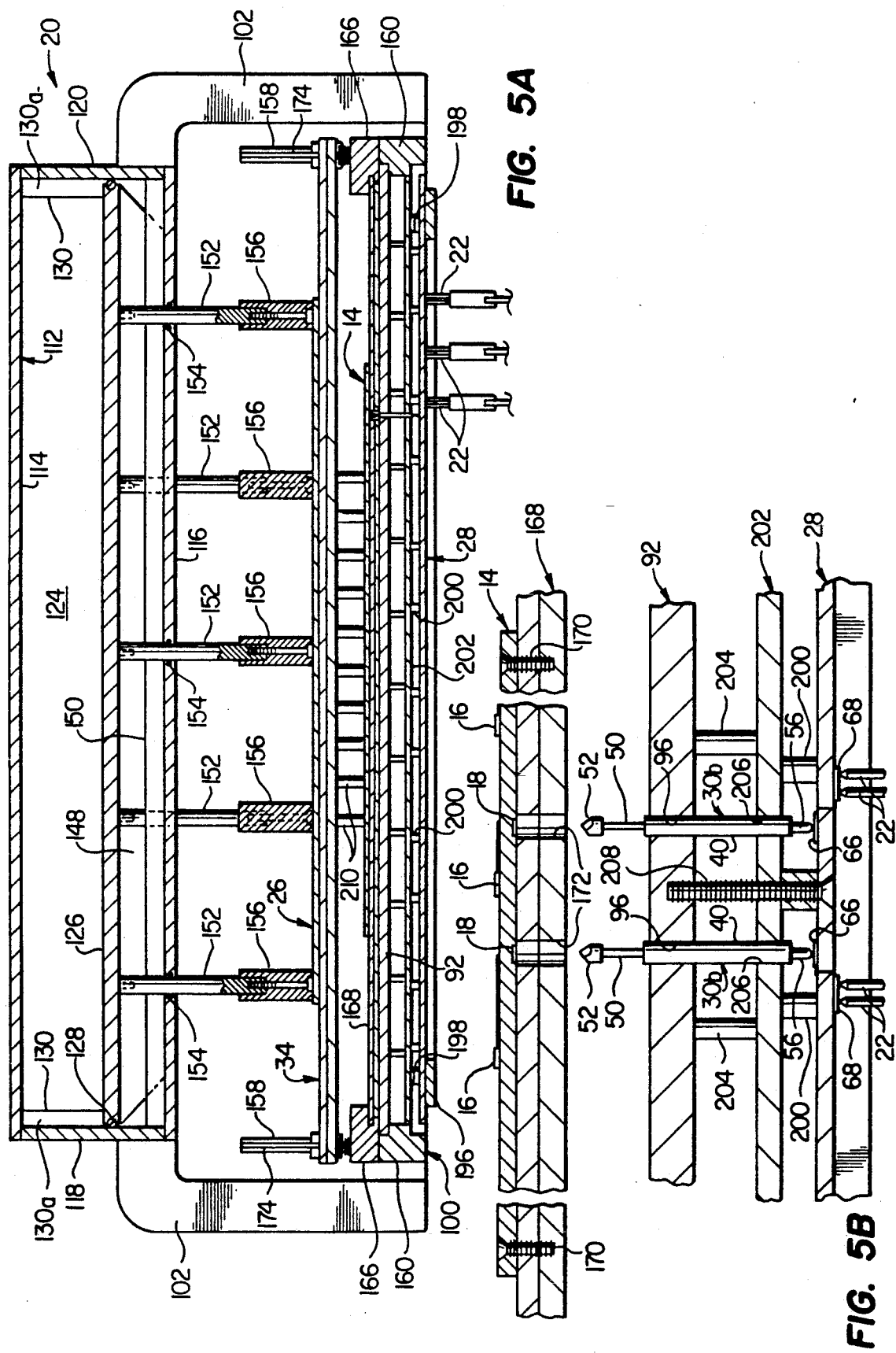

COMPACT, WIRELESS APPARATUS FOR ELECTRICALLY TESTING PRINTED CIRCUIT BOARDS

BACKGROUND OF THE INVENTION

1. Field of the Invention

The present invention relates generally to electrical testing apparatus, and more particularly relates to apparatus for electrically testing printed circuit boards.

2. Description of Related Art

The simultaneous electrical testing of the circuitry on the opposite sides of a printed circuit board is conventionally carried out by contacting a multiplicity of test contact points on opposite sides of the board with first ends of electrically conductive, longitudinally resilient test pin members commonly referred to as "pogo" pins. The nonresilient opposite end of each test pin is electrically connected to an individual wire which is operatively connected at its opposite end to a test circuit that receives and combinatively analyzes the multiplicity of electrical signals flowing from the circuit board test contact points to the test circuit via the pogo pins and their associated wires.

This conventional method of electrically testing a printed circuit board has a variety of well known problems, limitations and disadvantages. For example, a modern high density printed circuit board may easily have, on its top and bottom sides, several thousand individual test points which must be electrically connected to the automatic test and analysis system. The time required to effect the point-to-point wiring from the corresponding number of pogo pins to the test and analysis circuit is accordingly quite high, and may very easily result in wiring errors. Additionally, there are inherent variances in the length and placement of the individual wires in such conventional individually wired test fixtures. This often causes integration problems where multiple fixtures are attached to multiple test systems in the manufacturing environment.

Conventional point-to-point wiring of a multiplicity of closely adjacent pogo pins to the associated test and analysis system quite often leads to undesirable electrical "coupling" of the individual signals that travel through the also closely adjacent individual wires, thereby adversely affecting the electrical performance of the overall test fixture apparatus. Another problem relating to the use of individual wires for each test pin is that the wires define relatively long paths through which the individual electrical signals must travel to and from the printed circuit board under test. These long electrical signal paths often adversely affect the ability to perform electrical testing of the printed circuit board at high frequencies.

A variety of mechanical problems are also typically associated with conventional test fixture apparatus employing point-to-point wiring between the multiplicity of test pins and associated contact points in the automatic test and analysis circuit. For example, it is common practice to drive the printed circuit board under test into engagement with the transversely oriented test pin members using a vacuum force imposed directly on the printed circuit board. As a practical matter, this requires that the circuit board under test be nonpermeable, and essentially precludes the use of vacuum-driven actuation systems in the electrical testing of circuit boards of perforated or highly porous construction. Additionally, the inherent flexing of the circuit board under test due to atmospheric pressure on its top surface, as well as the opposing forces applied on the underside of the circuit board by the necessary spring-loaded test pins, in many cases renders the use of a vacuum-driven actuation system, to effect the fixture-to-unit under test interface, impractical. This is particularly true when a relatively large area printed circuit board is to be tested.

In an effort to eliminate the various problems associated with point-to-point wiring in the electrical testing of printed circuit boards, various proposals have been made for effecting the necessary interface between the circuit board being tested and the test and analysis circuitry without using individual wires. For example, under one previous proposal the electric signal transfer between the test contact points on the opposite sides of the circuit board and the test and analysis circuit is effected by using interface boards positioned above and below the circuit board under test.

A large number of openings are formed through the interface boards, with the wire connection ends of conventional test pins being inserted and soldered into some of the openings, and connector members being inserted and soldered into the remaining openings in each interface board and engaging conductive contact points on the outer sides of the boards. Electrically conductive etch lines are formed on the inner side surfaces of the interface boards to appropriately interconnect their test pins and connector members, and the inwardly projecting depressible ends of the test pins are aligned with the top and bottom side test contact points on the circuit board being tested for engagement therewith. Suitable circuitry is added to electrically interconnect the top and bottom interface boards to permit the necessary interconnection thereof to the test and analysis circuitry.

While this testing scheme succeeds in eliminating much of the point-to-point wiring used in more conventional test fixture apparatus, it has two primary disadvantages which render it less than entirely satisfactory as a replacement for test fixtures using the conventional point-to-point wiring format. First, the construction of the interface boards is a laborious and time-consuming task since each of the multiplicity of test pins, and their associated connector members, must be inserted and soldered into the through-holes formed in their associated interface board. Additionally, for each of the interface boards, the test pins must be appropriately interconnected to their associated connector members by means of the aforementioned electrically conductive etch lines.

Second, this through-hole connection technique, particularly when a "high density" printed circuit board is to be tested, requires that a large surface area of each interface board be dedicated to the openings required for the connection of the test pins and connector members thereto. Accordingly, the board surface area available for the necessary etch paths is correspondingly reduced. Due to the typically great number of individual etch paths required, this in turn requires that the interface boards have surface areas considerably larger than the opposite surface areas of the printed circuit board being tested. Because of this heretofore unavoidable requirement, it is often the case that the circuit board being tested cannot be positioned directly over the upwardly projecting probes of the test and analysis circuit. Instead, the circuit board being tested must be horizontally shifted relative to the probe points of the test and analysis circuitry, thereby substantially and quite undesirably increasing the overall horizontal dimensions of the test fixture apparatus.

From the foregoing it can be readily seen that it would be highly desirable to provide an electrical testing system for printed circuit boards which eliminates or at least substantially reduces the problems, limitations and disadvantages heretofore associated with conventional test systems of the general types described above. It is accordingly an object of the present invention to provide such a system.

SUMMARY OF THE INVENTION

In carrying out principles of the present invention, in accordance with a preferred embodiment thereof, a wireless test fixture is provided for simultaneously performing electrical tests on the opposite sides of a printed circuit board. The test fixture is operative to transmit electrical test signals, from test contact points on the opposite sides of the printed circuit board, to the contact pins of a conventional test and analysis circuit adjacent the fixture without using the conventional multiplicity of individual wires to interconnect the test contact points to the contact pins.

From a broad perspective, this unique wireless testing method is carried out utilizing printed circuit means, instead of the usual large number of discrete wires, to form electrical signal transfer paths between the circuit board test contact points and the contact pins of the test and analysis circuit. Interfaces between the test contact points and these printed circuit means are formed utilizing specially designed, electrically conductive test pins each having longitudinally depressible, spring-biased opposite first and second outer end portions.

The test fixture, in a preferred embodiment thereof, includes first and second interface boards each having test contact points thereon, and printed circuit means connected to the test contact points and operative to transmit electrical signals to or from the test contact points as necessary. Means are provided for supporting the printed circuit board between the first and second interface boards in a parallel, laterally facing and spaced apart relationship therewith, and for permitting lateral movement of the printed circuit board and first interface board relative to one another and relative to the second interface board which is held in a stationary position, with test contact points on its outer side operatively engaging the contact pins on the test and analysis circuit. The printed circuit means on the first and second interface boards are operatively interconnected by a flexible printed circuit member extending therebetween.

The double-ended test contact pins are arranged in first and second spaced apart series respectively positioned transversely between the first interface board and the printed circuit board, and between the printed circuit board and the second interface board. Means are provided for securing the first series of test pins to the first interface board with the first end portions of the pins engaging and being longitudinally depressed by test contact points on the inner side of the first interface board. With the three boards in a laterally spring-biased pre-test position, the second end portions of the first series of test pins are aligned with and spaced apart from a series of test contact points on the side of the printed circuit board which faces the second interface board.

Drive means are provided for moving the first interface board and the printed circuit board toward the second interface board to a test position in which the second end portions of the first and second series of test pins engage and are longitudinally depressed by test contact points on the opposite sides of the printed circuit board. With the three boards in their test position, a wireless test signal circuit is established between the printed circuit board test contact points and the contact pins on the test and analysis circuit, such wireless circuit being formed by the test pins, the printed circuit means on the first and second interface boards, and the flexible printed circuit member interconnected between the first and second interface boards.

According to a feature of the present invention, the drive means utilized to drive the first interface board and the printed circuit board to their test position include a housing disposed laterally outwardly of the first interface board, and a plate member slidably disposed within the housing for lateral movement relative thereto toward and away from the first interface board. Vaccum creating means are communicated with the interior of the housing and are operative to selectively drive the plate member in such opposite directions.

In response to vacuum-driven movement of the plate member toward the first interface board a force exerting structure secured to the plate member, and disposed externally of the housing, engages and drives the first interface board toward the printed circuit board and, through the action of linking means interconnecting the first interface board and the printed circuit board, also drives the printed circuit board toward the second interface board until the first interface board and the printed circuit board are brought to their previously mentioned test positions. Because a vacuum force is not directly exerted on the printed circuit board, both nonperforate and perforated printed circuit boards may be tested with the fixture apparatus of the present invention.

According to another aspect of the invention, the aforementioned first end portions of the first and second series of test pins are held against their associated test contact points on the first and second interface boards in a manner such that these first end portions are continuously depressed through an optimal portion of their total available longitudinal strokes-representatively through about two thirds of such available strokes. Additionally, the aforementioned drive means and linking means cooperate in a manner such that when the first interface board and the printed circuit board are driven to and held in their test positions, the second end portions of the first and second series of test pins are also depressed, against their associated test contact points on the printed circuit board, through an optimal portion of their total available longitudinal strokes-representatively through about two thirds of such available strokes. The circuitry contact forces at the opposite ends of the test pins are thus optimized when the three boards are in their test position.

Although the various aspects of the present invention are representatively embodied in fixture apparatus adapted to simultaneously test the opposite sides of a printed circuit board, it will be readily appreciated that principles of the invention could also be advantageously utilized to test only one side of a printed circuit board if desired.

The unique combination of the double-ended test pins and the printed circuit means which operatively interconnect them to the test and analysis circuit provides a variety of advantages over the point-to-point wiring methods conventionally utilized to transfer test signals from a printed circuit board to its associated test and analysis circuit. For example, considerable savings in fixture set-up time and expense are achieved, while at the same time the possibility of circuitry routing errors is significantly reduced. Moreover, undesirable "crosstalk" between adjacent test signals being transmitted to the test and analysis circuit is substantially minimized.

Further, the wireless test circuitry of the present invention, unlike point-to-point wiring, is well suited to the high frequency testing of printed circuit boards. It is additionally well suited, from a space requirement standpoint, to the testing of very high density printed circuit boards, being sufficiently compact to permit the board being tested to be positioned directly over the test and analysis circuit contact pins instead of having to be laterally shifted relative thereto as typically required in previously proposed wireless test circuits.

BRIEF DESCRIPTION OF THE DRAWINGS

FIG. 1 is a highly schematic side elevational view of a portion of a printed circuit board being electrically tested on its opposite sides using wireless test apparatus and methods embodying principles of the present invention;

FIG. 2 is an enlarged scale, partially cut away side elevational view of one of the double-ended test pin structures schematically illustrated in FIG. 1;

FIG. 5 is a rearwardly directed cross-sectional view taken through the fixture along line 5—5 of FIG. 3 with the fixture in its unactuated, pre-test position and all but a few of the various test pin structures having been removed for illustrative purposes;

FIG. 5A is a cross-sectional view similar to that in FIG. 5, but with the fixture in its actuated, testing position;

FIG. 5B is an enlargement of the dashed area "A" in FIG. 5;

FIG. 6 is a schematic rear side perspective view of a vacuum-driven actuation portion of the fixture; and FIG. 7 is an enlarged scale perspective detail view of a right front corner portion of the fixture illustrating the interconnection between push-down, top and probe plate portions of the fixture.

DETAILED DESCRIPTION

Figure 3:
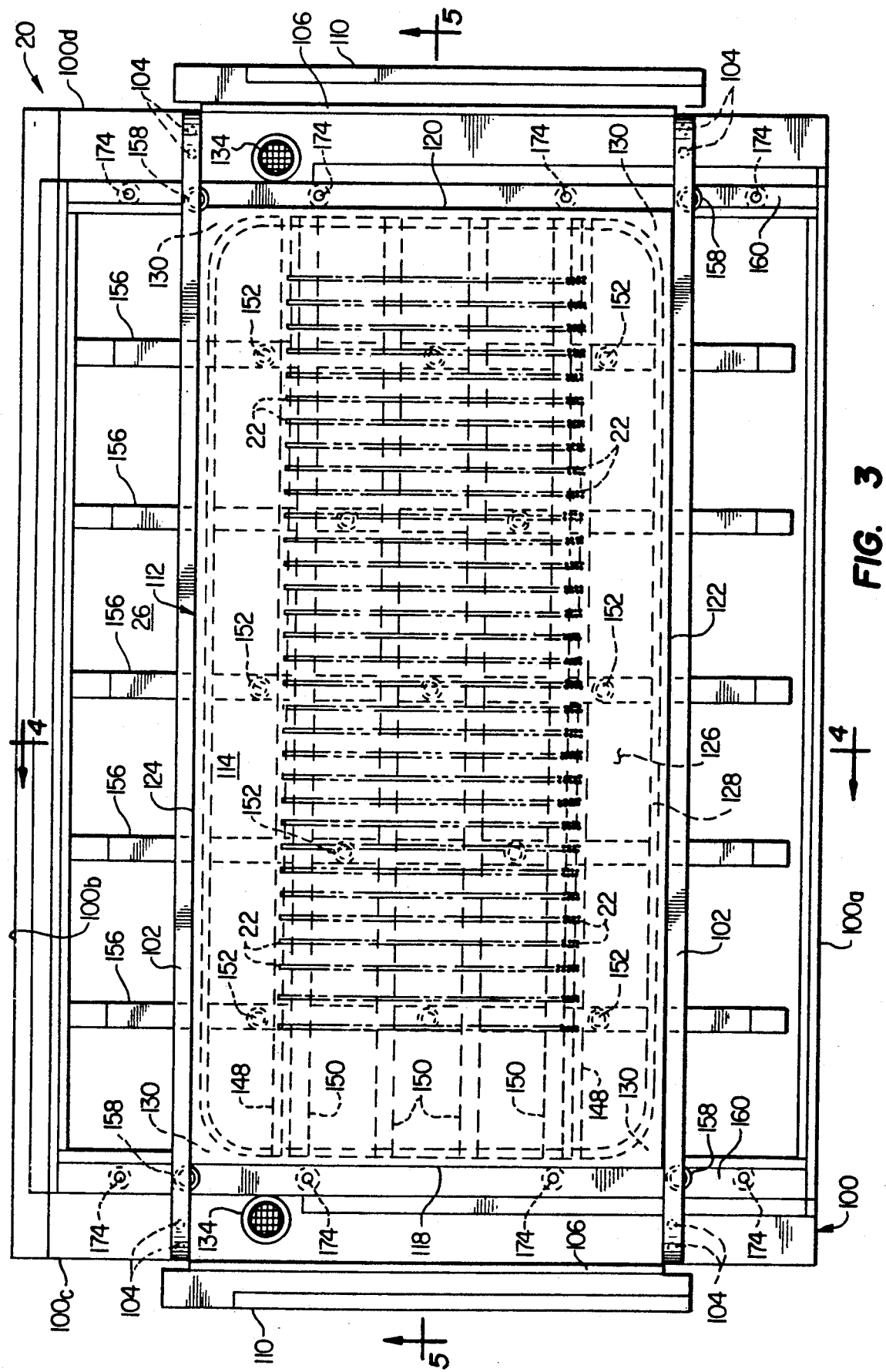
FIG. 3 is a top plan view of a wireless test fixture embodying principles of the present invention and utilized to perform the wireless test method thereof, the fixture being operatively supported over a conventional "bed of nails" electrical diagnostic system, with portions of the fixture, including the unit under test, having been removed for illustrative purposes.

As illustrated in FIG. 1 in highly schematic form, the present invention provides a method, and associated apparatus, for performing electrical tests on the upper and lower sides 10, 12 of a printed circuit board 14 respectively provided on its upper and lower sides with spaced series of test contact points 16 and 18. As will be subsequently described in greater detail, a specially designed wireless test fixture 20 (a portion of which is schematically depicted in FIG. 1) is utilized to transmit electrical test signals, emanating at the test contact points 16 and 18, to the upwardly projecting resilient test pins 22 arranged in parallel rows on a conventional test and analysis circuit 24 disposed beneath the fixture 20.

The portions of the fixture 20 schematically illustrated in FIG. 1 include an upper printed circuit interface board 26 disposed above and parallel to the printed circuit board 14 being tested, a lower printed circuit interface board 28 interposed between the test pins 22 and the underside of the circuit board 14, a spaced apart upper series of test pins $30_a$ interposed between and transverse to the boards 14 and 26, a lower spaced apart series of test pins $30_b$ interposed between and transverse to the boards 14 and 28, and an elongated flexible printed circuit member 32 electrically interconnecting the upper and lower printed circuit interface boards 26 and 28.

The upper printed circuit interface board 26 is secured to the top side of a push-down plate 34, as by screws 36, and the bottom side of the upper interface board 26 has formed thereon a spaced series of test contact points 38 which are horizontally aligned with the upper side test contact points 16 on the printed circuit board 14. As illustrated in FIG. 2, each of the electrically conductive test pins 30 has an elongated hollow barrel portion 40 with opposite open ends 42 and 44 and opposed cylindrical spring members 46 and 48 captively retained within the barrel. A cylindrical first test pin end portion 50, having a pointed outer end 52, is telescoped within one end of the barrel 40 and is resiliently compressible into the barrel, against the resistance of spring 46, as indicated by the double-ended arrow 54. A somewhat shorter second cylindrical test pin end portion 56, having a rounded outer end 58, is telescoped within the opposite end of the barrel 40 and is longitudinally compressible into the barrel, against the resistance of spring 48, as indicated by the double-ended arrow 60.

As indicated in FIG. 1, the barrel portions 40 of the upper test pins $30_a$ are anchored within cylindrical openings 62 in the push-down plate 34 in a manner such that the pin end portions 56 engage and are longitudinally compressed against the test contact points 38 on the bottom side of the upper printed circuit interface board 26, with the axes of the pins $30_a$ being aligned with the upper side test contact points 16 on the printed circuit board 14. The barrel portions 40 of the upper test pins $30_a$ are longitudinally positioned within the board openings 62 in a manner such that the end portions 56 of the pins $30_a$ are optimally compressed, representatively through two-thirds of the available inward stroke of the pin end portions 56. In a manner subsequently described, the push-down plate 34 may be downwardly driven, as indicated by the arrow 64, to engage the downwardly projecting end portions 50 of upper pins $30_a$ against the upper side test contact points 16 and upwardly compress the pin portions 50 through an optimal two-thirds of their available stroke.

The lower printed circuit interface board 28 is stationarily positioned, and has upper side test contact points 66 which are horizontally aligned with the lower side test contact points 18 on the printed circuit board 14. The lower interface board 28 is also provided on its bottom side with a spaced series of test contact points 68 which engage and vertically compress the test and analysis circuit pins 22. The upper and lower side test contact points 66, 68 are operatively interconnected by printed circuitry 70, 72 extending along the upper and lower side surfaces of the board 28 and interconnected through the board 28 by vertically extending "vias" 74.

For purposes later described, each of the lower side test contact points 38 on the upper interface board 26 is connected to one of a series of printed circuit transfer paths 76 extending along the lower side surface of the board 26. Additionally, for purposes later described, printed circuit transfer paths 78 are formed along the upper side surface of the lower interface board 28 and are operatively connected to some of the lower test contact points 68 by means of vertically extending vias 80 and printed transfer circuitry 82 extending along the bottom side of the interface board 28.

As illustrated, an upper end portion of the flexible printed circuit member 32 extends upwardly through an opening 84 in the push-down plate 34, with the individual etched circuits 86 of the flexible printed circuit member 32 being connected at their upper ends with the printed circuit transfer paths 76 by means of a conenctor 88. In a similar fashion, a lower end portion of the flexible printed circuit member 32 extends downwardly through an opening 90 in a stationarily supported probe plate 92 which is interposed between and parallel to the printed circuit board 14 and the lower printed circuit interface board 28. The lower ends of the etched circuits 86 are operatively connected to the printed circuit transfer paths 78 by means of a connector 94.

The barrel portions 40 of the lower test pins 30$_b$ are suitably anchored within a series of openings 96 in the stationary probe plate 92 and, in a manner subsequently described, the downwardly projecting pin end portions 56 of the lower pins 30$_b$ are held and longitudinally depressed against the upper side test contact points 66 on the lower interface board 28, with such pin portions 56 being optimally compressed through two-thirds of their available upward stroke. When the push-down plate 34 is downwardly moved as previously mentioned, the printed circuit board 14 is also moved downwardly, as indicated by the arrow 98, to cause the lower side test contact points 18 on the printed circuit board 14 to engage the pin end portions 50 of the lower test pins 30$_b$ and downwardly compress them through an optimal two-thrids of their available downward stroke.

With the illustrative portions of the test fixture 20 in their depicted test positions, electrical test signals emanating from the lower side test contact points 18 on the printed circuit board 14 are routed to their associated test and analysis circuit pins 22 sequentially through the lower test pins 30$_b$, the upper side test contact points 66 on the lower interface board 28, the printed circuitry 70, the vertically extending vias 74, the bottom side printed circuitry 72, and the bottom side test contact points 68 on the lower interface board 28.

At the same time, electrical test signals emanating from the top side test contact points 16 on the printed circuit board 14 are routed to their associated test and analysis circuit pins 22 sequentially through the upper test pins 30$_a$, the bottom side test contact points 38 on the upper interface board 26, the printed circuit transfer paths 76 on the underside of the interface board 26, the etched circuits 86 in the flexible printed circuit member 32, the printed circuit transfer paths 78 on the upper side of the lower interface board 28, the vertically extending vias 80, the printed transfer circuitry 82 on the underside of the lower interface board 28, and the lower side test contact points 68.

As can be seen from the foregoing conceptual description of portions of the test fixture 20, the present invention uniquely provides a wireless interface between the printed circuit board 14 being tested and the underlying conventional test and analysis circuit 24. This wireless interface formed by the double-ended test pins 30, the printed circuit interface boards 26 and 28, and the flexible printed circuit member 32, eliminates the previous necessity of connecting a multiplicity of individual wires to conventional single-ended test pins and individually routing the great number of wires to the test and analysis circuit.

Due to this unique elimination of point-to-point wiring in the test fixture 20, a variety of advantages are achieved. For example, considerable labor and cost savings are gained utilizing printed circuitry as the electrical signal transfer mechanism instead of individual wires. Additionally, far less chance for test circuitry error is presented, and a decidedly more compact and less cluttered test fixture configuration is achieved. In addition to these advantages, the printed circuit signal transfer paths are far less prone to create undesirable "cross-talk" between adjacent test signals.

Another advantage of this wireless interface is that, in constrast to conventional point-to-point wired interfaces, it is quite amenable to the high frequency testing of high density circuit boards. Moreover, unlike a multiplicity of individual connecting wires of varying lengths, the printed circuitry on the upper and lower interface boards may be easily "matched" to the electrical characteristics of the printed circuit board 14 being tested. The signal transfer routing paths defined by the printed circuitry on the upper and lower interface boards may also be easily computer-optimized with respect to their lengths and positions relative to one another.

Compared to previous attempts at wireless interfacing in a circuit board testing context, using through-hole mounting of conventional test pins and their associated connector members, the wireless interfacing apparatus and methods of the present invention also offer several important advantages. For example, due to the unique use of the double-ended test pins 30, and the absence of pin and connector mounting through-holes in the interface boards 26 and 28, the printed signal transfer circuitry on the boards 26, 28 may be arranged thereon in a sufficiently compact manner to permit the printed circuit board 14 being tested to be supported directly over the test and analysis circuit pins 22—it does not have to be horizonally shifted to one side of such pins. Accordingly, a particularly compact test configuration is advantageously achieved. Moreover, the wireless interface apparatus of the present invention may be more economically and quickly manufactured, and significantly reduces the possibility for test circuitry errors.

In addition to the electrical advantages provided by the wireless test fixture 20, it also provides a variety of mechanical advantages over conventional vacuum-driven circuit board test fixtures, as will now be described in conjunction with FIGS. 3-7. As illustrated in FIGS. 3, 4, 5 and 6, the test fixture includes, on its bottom side, a rectangular open frame structure 100, the frame structure 100 being positioned over the parallel rows of test and analysis circuit pins 22 (FIG. 3) and having front and rear sides 100$_a$, 100$_b$ and left and right ends 100$_c$, 100$_d$.

The lower ends of two spaced apart, inverted U-shaped support brackets 102 are secured to the left and right ends of the frame 100 by fastening members 104 (FIG. 3). A pair of elongated carrying brackets 106 (FIGS. 3 and 5) are transversely secured to the ends of the brackets 102 and have outwardly projecting flange portions received in slots 108 in vertically movable carrying bars 110 associated with the test and analysis circuit and operative to selectively move the test fixture 20 upwardly and downwardly relative to the test and analysis circuit pins 22.

Secured between the horizontally extending upper sides of the support brackets 102 is an elongated rectangular metal vacuum housing 112 having a top wall 114, a bottom wall 116, left and right end walls 118 and 120, and front and rear side walls 122 and 124. An elongated rectangular plate member 126, having rounded corner portions and a peripheral seal element 128, is slidably disposed within the housing 112 for vertical movement relative thereto between an upper limit position illustrated in FIGS. 4 and 5 and a lower limit position illustrated in FIGS. 4A and 5A. To accommodate the rounded corner portions of the plate member 126, corner insert members 130 having arcuate inner side surfaces 130$_a$ are vertically positioned within the corners of the housing 112.

The plate member 126 is vertically driven between its upper and lower limit positions by means of a vacuum system which is schematically illustrated in FIG. 6. The vacuum system includes a pair of vacuum pumps 132 having inlets 134 which are communicated with a pair of solenoid valves 136 via conduits 138. Also connected to each of the solenoid valves 136 are a pair of conduits 140 which communicate with the interior of the housing 112 through openings 142 extending through the housing end walls 118 and 120 below the plate member 126, and a pair of conduits 144 communicating with the interior of housing 112 through a pair of openings 146 formed through the top wall 114 of the housing.

Each of the solenoid valves 136 is operable to communicate a selected one of its branch conduits 140, 144 with its conduit 138 to selectively evacuate either the portion of the housing interior beneath the plate member 126, or to evacuate the portion of the housing interior above the plate member. Accordingly, during operation of the vaccum pumps 132 with the conduits 140 communicated with their associated conduits 138, the plate member 126 is driven downwardly to its lower limit position, and when the conduits 144 are communicated with their associated conduits 138, the plate member 126 is driven upwardly to its upper limit position.

Figure 4:
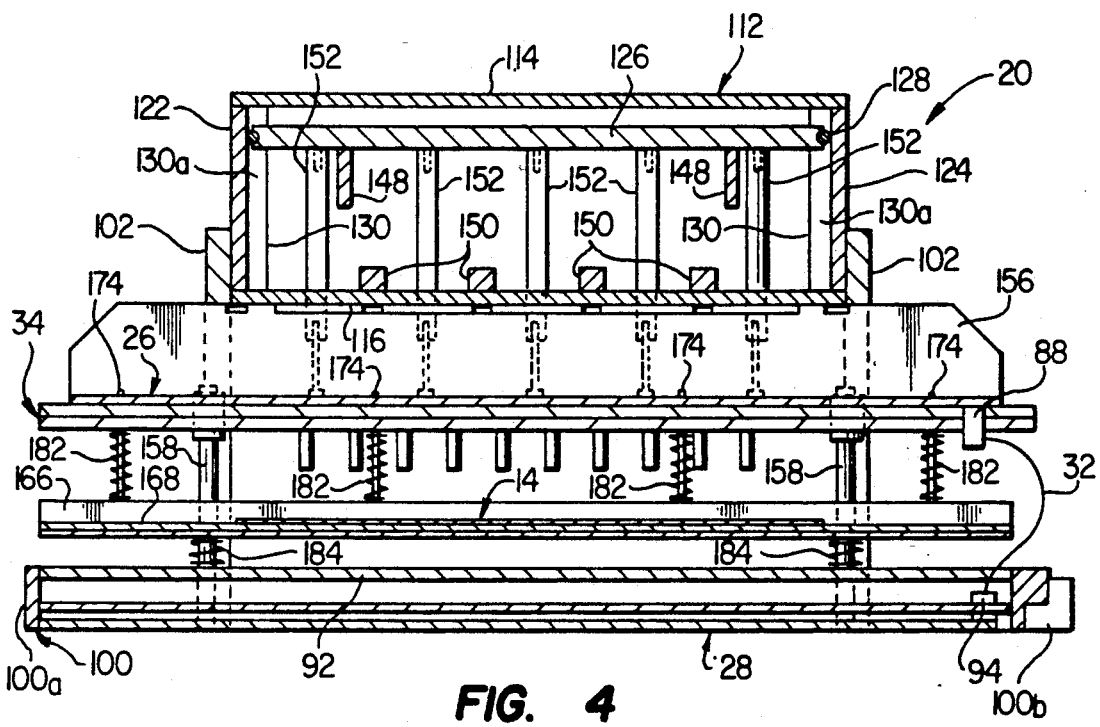
FIG. 4 is a leftwardly directed cross-sectional view taken through the fixture along line 4—4 of FIG. 3 with the fixture in its unactuated, pre-test position and all of the various test pin structures having been deleted for illustrative purposes.

The plate member 126 has a pair of elongated stop members 148 secured to and projecting downwardly from its lower side, the stop members, as best illustrated in FIGS. 4 and 5, serving to engage the housing bottom wall 116 and downwardly stop the plate member 126 when it reaches its lower limit position. The bottom housing wall 116 is structurally reinforced by four elongated stiffener members 150 secured to and extending lengthwise along its upper side surface. A spaced series of vertical drive rods 152 extend upwardly through the bottom housing wall 116, through circular openings therein provided with O-ring seals 154, and are suitably anchored at their upper ends to the underside of the plate member 126. The lower ends of the rods 152 are anchored to a spaced series of horizontally extending drive bars 156 which extends transversely to the vacuum plate stop members 148. As illustrated in FIGS. 4 and 5, the upper sides of the drive bars 156 are engageable with the underside of the bottom housing wall 116 to stop the vertical movement of the plate member 126 when it upwardly reaches its upper limit position. As can be seen by comparing FIGS. 4 and 5 to FIGS. 4A and 5A, a vertical movement of the plate member 126 causes a corresponding vertical movement of the drive bars 156.

The previously mentioned push-down plate 34, to the top side of which the upper interface board 26 is secured, is positioned beneath the lower sides of the drive bars 156 and is supported for vertical movement relative to the bottom frame structure 100 by four vertical support rods 158 (see FIGS. 3, 4 and 7) which are anchored at their lower ends to a pair of support bars 160 anchored to the frame structure 100. The rods 158 (FIG. 7) extend upwardly through suitable slide bearings 162 positioned adjacent the corners of the push-down plate 34, and also slidably pass through slide bearings 164 carried by a pair of support bars 166 disposed between the bars 160 and the push-down plate 34.

The support bars 166 are secured to and extend along opposite side edges of a top plate structure 168 to the top side of which the printed circuit board 14 is secured by screws 170 as best illustrated in FIG. 5B. Top plate 168 is positioned above the stationary probe plate 92 which is secured along opposite side edges thereof to the support bars 160 which define a portion of the bottom frame 100. Extending upwardly through the top plate 168 are a spaced series of circular openings 172 (see FIG. 5B) which underlie the bottom side test contact points 18 on the printed circuit board 14 and are also aligned with the top end portions 50 of the bottom test pins 30$_b$ which are anchored to the probe plate 92.

Referring now to FIG. 7, spaced apart along the length of the support bars 166 are a series of small diameter vertical rods 174 which are anchored at their upper ends to the support bars 166 and slidably pass upwardly through cylindrical guide sleeves 176 in the push-down plate 34. As illustrated in FIG. 7, the push-down plate 34 is movable upwardly and downwardly relative to the top plate 168, as indicated by the double-ended arrow 178, and the top plate 168 is movable upwardly and downwardly relative to the push-down plate 34 and the probe plate 92 as indicated by the double-ended arrow 180. The push-down plate 34 is resiliently biased upwardly away from the top plate 168 by means of coil spring members 182 which outwardly circumscribe the rods 174 and bear at their opposite ends upon the push-down plate 34 and the support bars 166. In a similar fashion, the top plate 168 is resiliently biased upwardly away from the stationary probe plate 92 by means of coil spring members 184 (only one of which is visible in FIG. 7) which outwardly circumscribe the vertical rods 158 and bear at their opposite ends against the support bars 160 and the support bars 166.

For purposes later described, the push-down plate 34 and the top plate 168 are linked by a series of generally T-shaped hanger plate members 186 (only one of which is visible in FIG. 7) which are spaced apart along the opposite left and right side edges of the push-down plate 34. Each of the hanger plates 186 has a top portion 188 anchored to a side edge of the push-down plate 34, and a downwardly extending bottom portion 190 having a vertically elongated slot 192 which receives an outwardly projecting pin 194 anchored to the support bar 166.

In the absence of a downwardly directed force on the push-down plate 34, the springs 182 and 184 operate to hold the plates 34, 168 in a pre-test position, depicted in FIG. 7, in which the pins 94 engage the bottom ends of the hanger plate slots 192 to limit the upward movement of the push-down plate 34 relative to the top plate 168. With the plates 34, 168 and 192 in this pre-test position, the upwardly projecting end portions 50 of the lower double-ended test pins $30_b$ (FIG. 1) are positioned downwardly apart from the top plate 168, and the downwardly projecting end portions 50 of the upper double-ended test pins $30_a$ (FIG. 1) are spaced upwardly apart from the printed circuit board 14.

Referring now to FIGS. 5 and 5B, the bottom interface board 28 is positioned on the top side of a dress ring member 196 which is suitably anchored within the open bottom frame 100. To horizontally align the bottom interface board 28 with the rest of the test fixture apparatus, alignment pins 198 on the dress ring 196 are extended upwardly through corresponding openings formed through the bottom interface board. Positioned directly above the bottom interface board 28, and separated therefrom by spacer members 200, is an alignment plate 202 which is peripherally anchored within the bottom frame 100. Alignment plate 202 is positioned beneath the stationary probe plate 92 and vertically separated therefrom by spacers 204, with the barrel portions 40 of the lower test pins $30_b$ extending downwardly through corresponding circular openings 206 formed transversely through the alignment plate 202.

As best illustrated in FIG. 5B, the plates 92, 202 and the bottom interface board 28 are fixedly interconnected in their illustrated relative positions by means of a series of screws 208 extended upwardly through these three components. The spacers 200, 204 are vertically sized in a manner such that the bottom end portions 56 of the lower test pins $30_b$ engage and are upwardly depressed by the upper side test contact points 66 on the bottom interface board 28, such lower end portions 56 being upwardly depressed through an optimal two-thirds of their available depression strokes.

With the vacuum plate member 126 in its upper limit position (FIGS. 4 and 5), and the plate structures 34, 168 and 92 in their spring-biased pretest positions, the lower sides of the drive bars 156 are just slightly above the top interface board 26. When it is desired to simultaneously test the opposite sides of the printed circuit board 14, the plate 126 is vacuum-driven in a downward direction to downwardly move the drive bars 156 into engagement with the top interface board 26, thereby downwardly driving the push-down plate 34 toward the top plate 168. As the push-down plate 34 approaches the top plate 168, the lower end portions 50 of the upper test pins $30_a$ (FIG. 1) are brought into engagement with, and upwardly depressed by, the top side test contact points 16 on the printed circuit board 14. When these lower pin end portions 50 are upwardly depressed through an optimal two-thirds portion of their available depression stroke, a series of stand off members 210 on the bottom side of the push-down plate 34 engage the top side of the printed circuit board 14, thereby terminating the upward depression of the upper test pin end portions 50 and causing the top plate 168 to be driven downwardly with the push-down plate 34.

This downward movement of the plates 34 and 168 continues until the bottom sides of the vacuum plate stop members 148 are brought into engagement of the upper side surface of the lower housing wall 116 when the vacuum plate 126 reaches its aforementioned lower limit position. Downward movement of the top plate 168 to its final test position causes the upper ends 52 of the lower test pins $30_b$ (FIG. 5B) to be moved upwardly through the openings 172 in the top plate 168 and downwardly depress the upper end portions 50 of the lower test pins $30_b$ through an optimal two-thirds portion of their available depression stroke.

Figure 4A:
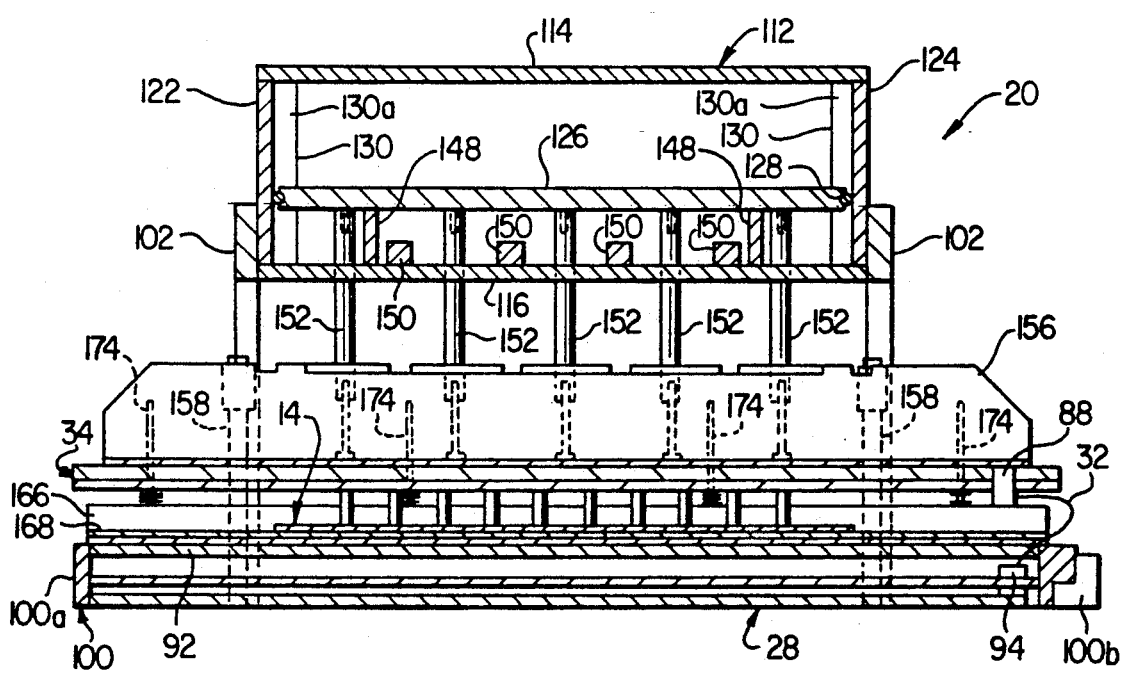
FIG. 4A is a cross-sectional view similar to that in FIG. 4, but with the fixture in its actuated, testing position.

Accordingly, when the plate structures 34 and 168 are downwardly brought to their test position depicted in FIGS. 4A and 5A, the opposite end portions of each of the upper and lower test pins $30_a$, $30_b$ are optimally depressed through two-thirds of their available longitudinal strokes.

After the printed circuit board has been simultaneously tested on its opposite sides, the vacuum plate 126 is simply driven upwardly to its upper limit position depicted in FIGS. 4 and 5, thereby permitting the plate structures 34 and 168 to be spring-returned to their pre-test positions depicted in FIGS. 4A and 4B, and the now tested printed circuit board 14 can be removed from the fixture apparatus and replaced with another printed circuit board to be tested.

The vacuum-actuated mechanical drive system just described does not directly impose a vacuum force on the printed circuit board 14. Accordingly, the fact that the printed circuit board 14 may be of a perforated or highly porous is of no consequence. Accordingly, the use of the spaced apart drive bars 156 permits the downward mechanical driving force of the vacuum-actuated drive system to be evenly distributed across the top interface board 26 and, via the standoff members 210, evenly distributed across the printed circuit board 14 so that even a very large printed circuit board may be tested in the previously described fixture apparatus without mechanical warpage or other damage to the board being tested.

The foregoing detailed description is to be clearly understood as being given by way of illustration and example only, the spirit and scope of the present invention being limited solely by the append claims.

What is claimed is:

1. A method of transmitting electrical test signals from a mutually spaced series of first test contact points, disposed on a side surface of a printed circuit board being tested, to a series of spaced apart locations on a test and analysis circuit adapted to receive and analyze said electrical test signals, said method comprising the steps of:

providing an interface board with a mutually spaced series of second test contact points formed on a side surface thereof, and first printed circuit means disposed thereon for transmitting electrical signals received at said second test contact points;

providing a mutually spaced series of electrically conductive test pins each having longitudinally depressible, spring-biased opposite first and second end portions;

supporting said series of test pins on said interface board in a manner such that said test pins are aligned with and project transversely outwardly from said second test contact points with said second test pin end portions being held against and longitudinally depressed by said second test contact points;

positioning said interface board in a parallel, spaced relationship with said printed circuit board, with said first test contact points being aligned with, facing, and spaced outwardly apart from said first test pin end portions;

creating electrical signal transfer paths between said first printed circuit means and said series of spaced apart locations on said test and analysis circuit;

creating relative lateral movement between said printed circuit board and said interface board to longitudinally depress said first test pin end portions against said first test contact points, said step of creating relative lateral movement being performed by:

slidably disposing a plate member within a housing for lateral movement relative thereto, said plate member having a force exerting structure secured thereto and extending outwardly through a wall of said housing, creating a vacuum within said housing to drive said plate member toward said housing wall and move an exterior portion of said force exerting structure away from said housing wall, and causing said exterior portion of said force exerting structure to drive said interface board toward said printed circuit board; and transmitting said electrical test signals from said first test contact points to said series of spaced apart locations on said test and analysis circuit sequentially through said test pins, said second test contact points, said first printed circuit means, and said electrical signal transfer paths.

2. For use in conjunction with a test and analysis circuit adapted to receive electrical signals at spaced apart locations thereon and analyze the received signals, test fixture apparatus for electrically testing a printed circuit board having a side surface with first test contact points thereon, said test fixture apparatus comprising:

means for supporting said printed circuit board in a spaced relationship with said test and analysis circuit;

an interface board having second test contact points on a side surface thereof and first printed circuit means thereon for transmitting electrical signals received by said second test contact points;

means for supporting said interface board in a parallel, spaced apart relationship with said printed circuit board, with said first test contact points aligned with and facing said second test contact points;

a series of electrically conductive test pins each having longitudinally depressible, spring-biased opposite and second end portions;

means for transversely supporting said test pins between said printed circuit board and said interface board in a mutually spaced apart array in which said test pins are aligned with said first and second test contact points and said second end portions of said test pins engage and are longitudinally depressed by said second test contact points;

means operative to create relative lateral movement between said printed circuit board and said interface board to selectively move said first test pin end portions into longitudinally depressed engagement with said first test contact points, or to disengage said first test pin end portions from said first test contact points, said means operable to create relative lateral movement including:

a housing having a plate member slidably disposed therein for lateral movement relative thereto in opposite directions, vacuum means communicating with the interior of said housing on opposite sides of said plate member and operable to laterally move said plate member in a selected one of said opposite directions, and force exerting means, secured to said plate member for movement therewith in said opposite directions and projecting outwardly through said housing, for mechanically driving said interface board toward said printed circuit board, said force exerting means including a plurality of laterally spaced rods slidably extending through a wall of said housing transversely to said plate member, said rods having inner ends secured to said plate member, and outer ends secured to a plurality of parallel presser bar members adapted to engage said interface board and drive it toward said printed circuit board; and means for operatively connecting said printed circuit means on said interface board to said spaced apart locations on said test and analysis circuit.

3. For use in conjunction with a test and analysis circuit adapted to receive electrical signals at spaced apart locations thereon and analyze the received signals, test fixture apparatus for electrically testing a printed circuit board having a side surface with first test contact points thereon, said test fixture apparatus comprising:

means for supporting said printed circuit board in a spaced relationship with said test and analysis circuit;

an interface board having second test contact points on a side surface thereof and first printed circuit means thereon for transmitting electrical signals received by said second test contact points;

means for supporting said interface board in a parallel, spaced apart relationship with said printed circuit board, with said first test contact points aligned with and facing said second test contact points;

a series of electrically conductive test pins each having longitudinally depressible, spring-biased opposite first and second end portions;

means for transversely supporting said test pins between said printed circuit board and said interface board in a mutually spaced apart array in which said test pins are aligned with said first and second test contact points and said second end portions of said test pins engage and are longitudinally depressed by said second test contact points;

means operative to create relative lateral movement between said printed circuit board and said interface board to selectively move said first test pin end portions into longitudinally depressed engagement with said first test contact points, or to disengage said first test pin end portions from said first test contact points, said means operable to create relative lateral movement including:

a housing having a plate member slidably disposed therein for lateral movement relative thereto in opposite directions, vacuum communicating with the interior of said housing on opposite sides of said plate member and operable to laterally move said plate member in a selected one of said opposite directions, said vacuum means including a vacuum pump having an inlet, a first conduit communicating with said vacuum pump inlet, a second conduit communicating with the interior of said housing on one side of said plate member, a third conduit communicating with the interior of said housing on the opposite side of said plate member, and solenoid means interconnecting said first, second and third conduits and operable to communicate the interior of a selectively variable one of said second and third conduits with the interior of said first conduit, and force exerting means, secured to said plate member for movement therewith in said opposite directions and projecting outwardly through said housing, for mechanically driving said interface board toward said printed circuit board; and means for operatively connecting said printed circuit means on said interface board to said spaced apart locations on said test and analysis circuit.

4. A wireless test fixture for electrically testing a printed circuit board having a first side surface with a spaced series of first test contact points formed thereon, and a second side surface having a spaced series of second test contact points formed thereon, said wireless test fixture comprising:

a first interface board having a first side surface with a spaced series of third test contact points formed thereon and engageable by outwardly projecting pin members on a test and analysis circuit adapted to receive and analyze electrical signals, a second side surface with a spaced series of fourth test contact points thereon, first printed circuit means for electrically connecting said fourth test contact points to a first portion of said third test contact points, and second printed circuit means for receiving electrical signals and transmitting them to a second portion of said third test contact points;

a second interface board having a first side surface with a spaced series of fifth test contact points thereon, a second side surface, and third printed circuit means for transmitting electric signals from said fifth test contact points;

means for supporting said printed circuit board, said first interface board, and said second interface board in a parallel, laterally spaced apart and facing relationship in which said printed circuit board is disposed between said first and second interface boards with said second and fourth test contact points in a spaced apart, facing, aligned relationship, and said first and fifth test contact points in a spaced apart, facing, aligned relationship, said means for supporting including:

a push-down plate, means for securing said second interface board to said push-down plate, a top plate, means for securing said printed circuit board to said top plate, means for permitting movement of said push-down plate and said top plate toward and away from said first interface board, and spring means for biasing said top plate away from said first interface board, and for biasing said push-down plate away from said top plate;

flexible printed circuit means, operatively interconnected between said second and third printed circuit means, for transferring electrical signals from said third printed circuit means to said second printed circuit means;

a mutually spaced series of electrically conductive first test pins each having longitudinally depressible, spring-biases opposite first and second end portions;

means for holding said first test pins against said first interface board in a manner such that said first end portions of said first test pins are longitudinally depressed against said fourth test contact points with said second end portions of said first test pins projecting toward, aligned with and spaced apart from said second test contact points;

a mutually spaced series of electrically conductive second test pins each having longitudinally depressible, spring-biased opposite first and second end portions;

means for holding said second test pins against said second interface board in a manner such that said first end portions of said second test pins are longitudinally depressed against said first test contact points with said second end portions of said second test pins projecting toward, aligned with and spaced apart from said first test contact points; and means for selectively creating relative lateral movement between said printed circuit board and said first and second interface boards in a manner longitudinally depressing said second end portions of said first test pins against said second test contact points, and longitudinally depressing said second end portions of said second test pins against said first test contact points.

5. The wireless test fixture of claim 4 wherein:

said means for permitting movement include a plurality of support rods slidably extending transversely through said push-down plate and said top plate, and said wireless test fixture further comprises means for limiting movement of said push-down plate toward and away from said top plate.

6. The wireless test fixture of claim 5 wherein said means for limiting movement include:

a hanger member carried by one of said push-down plate and said top plate and having a slot extending transversely to said push-down plate and said top plate, and a pin carried by the other of said push-down plate and said top plate and received in said slot.

7. A wireless test fixture for electrically testing a printed circuit board having a first side surface with a spaced series of first test contact points formed thereon, and a second side surface having a spaced series of second test contact points formed thereon, said wireless test fixture comprising:

a first interface board having a first side surface with a spaced series of third test contact points formed thereon and engageable by outwardly projecting pin members on a test and analysis circuit adapted to receive and analyze electrical signals, a second side surface with a spaced series of fourth test contact points thereon, first printed circuit means for electrically connecting said fourth test contact points to a first portion of said third test contact points, and second printed circuit means for receiving electrical signals and transmitting them to a second portion of said third test contact points;

a second interface board having a first side surface with a spaced series of fifth test contact points thereon, a second side surface, and third printed circuit means for transmitting electric signals from said fifth test contact points;

means for supporting said printed circuit board, said first interface board, and said second interface board in a parallel, laterally spaced apart and facing relationship in which said printed circuit board is disposed between said first and second interface boards with said second and fourth test contact points in a spaced apart, facing, aligned relationship, and said first and fifth test contact points in a spaced apart, facing, aligned relationship;

flexible printed circuit means, operatively interconnected between said second and third printed circuit means, for transferring electrical signals from said third printed circuit means to said second printed circuit means;

a mutually spaced series of electrically conductive first test pins each having longitudinally, spring-biases opposite first and second end portions;

means for holding said first test pins against said first interface board in a manner such that said first end portions of said first test pins are longitudinally depressed against said fourth test contact points with said second end portions of said first test pins projecting toward, aligned with and spaced apart from said second test contact points;

a mutually spaced series of electrically conductive second test pins each having longitudinally depressible, spring-biased opposite first and second end portions;

means for holding said second test pins against said second interface board in a manner such that said first end portions of said second test pins are longitudinally depressed against said first test contact points with said second end portions of said second test pins projecting toward, aligned with and spaced apart from said first test contact points; and means for selectively creating relative lateral movement between said printed circuit board and said first and second interface boards in a manner longitudinally depressing said second end portions of said first test pins against said second test contact points, and longitudinally depressing said second end portions of said second test pins against said first test contact points, said means for selectively creating relative lateral movement including:

a housing having a plate member slidably disposed therein for lateral movement relative thereto in opposite directions, vacuum means communicating with the interior of said housing on opposite sides of said plate member and operable to laterally move said plate member in a selected on of said opposite directions, and force exerting means, secured to said plate member for movement therewith in said opposite directions and projecting outwardly through said housing, for mechanically driving said second interface board toward said printed circuit board.

8. The wireless test fixture of claim 7 wherein said force exerting means include:

a plurality of laterally spaced rods slidably extending through a wall of said housing transversely to said plate member, said rods having inner ends secured to said plate member, and outer ends secured to a plurality of parallel presser bar members adapted to engage said second interface board and drive it toward said printed circuit board.

9. The wireless test fixture of claim 7 wherein said vacuum means include:

a vacuum pump having an inlet, a first conduit communicating with said vacuum pump inlet, a second conduit communicating with the interior of said housing on one side of said plate member, a third conduit communicating with the interior of said housing on the opposite side of said plate member, and solenoid means interconnecting said first, second and third conduits and operable to communicate the interior of a selectively variable one of said second and third conduits with the interior of said first conduit.

* * * * *

UNITED STATES PATENT AND TRADEMARK OFFICE
CERTIFICATE OF CORRECTION

PATENT NO. : 5,157,325

DATED : October 20, 1992

INVENTOR(S) : Murphy, Patrick K.

It is certified that error appears in the above-identified patent and that said Letters Patent is hereby corrected as shown below:

Column 7, lines 24-25, "conenctor" should be --connector--.

Column 7, line 48, "two-thrids" should be --two-thirds--.

Column 8, line 28, "constrast" should be --contrast--.

Column 10, line 1, "extends" should be --extend--.

Column 11, line 46, "pretest" should be --pre-test--.

Column 14, line 67, "vacuum communicating" should be --vacuum means communicating--.

Signed and Sealed this

Eleventh Day of January, 1994

Attest:

BRUCE LEHMAN

Attesting Officer     Commissioner of Patents and Trademarks